(12) United States Patent
Oh (10) Patent No.: US 7,538,591 B2
(45) Date of Patent: May 26, 2009

(54) FAST LOCKING PHASE LOCKED LOOP FOR SYNCHRONIZATION WITH AN INPUT SIGNAL

(75) Inventor: Jung-Hoon Oh, Seoul (KR)

(73) Assignee: Samsung Electronics Co., Ltd. (KR)

( * ) Notice: Subject to any disclaimer, the term of this patent is extended or adjusted under 35 U.S.C. 154(b) by 45 days.

(21) Appl. No.: 11/789,330

(22) Filed: Apr. 24, 2007

(65) Prior Publication Data

US 2007/0285132 A1    Dec. 13, 2007

(30) Foreign Application Priority Data

May 23, 2006    (KR)    ............... 10-2006-0045925

(51) Int. Cl.
*H03L 7/06* (2006.01)
(52) U.S. Cl. .................... 327/156; 327/3; 327/147; 327/150; 327/159
(58) Field of Classification Search ............ 327/3, 327/156
See application file for complete search history.

(56) References Cited

U.S. PATENT DOCUMENTS

| | | | | |
|---|---|---|---|---|
| 5,592,109 A | * | 1/1997 | Notani et al. ................ | 327/3 |
| 5,815,041 A | * | 9/1998 | Lee et al. ..................... | 331/8 |
| 5,892,380 A | * | 4/1999 | Quist ......................... | 327/172 |
| 6,157,263 A | | 12/2000 | Lee et al. | |
| 6,542,041 B2 | * | 4/2003 | Choi ........................... | 331/17 |
| 2007/0132490 A1 | * | 6/2007 | Robinson et al. ............ | 327/156 |

FOREIGN PATENT DOCUMENTS

| | | |
|---|---|---|
| JP | 09-214333 | 8/1997 |
| KR | 10-0336760 | 5/2002 |
| WO | 97/39530 | 10/1997 |

* cited by examiner

*Primary Examiner*—Kenneth B Wells
*Assistant Examiner*—John W Poos
(74) *Attorney, Agent, or Firm*—Mills & Onello LLP

(57) ABSTRACT

A fast locking phase locked loop includes a first phase frequency detector (PFD), a second PFD, a lock detector, an up-signal output unit, a down-signal output unit, a selective charge pump, a loop filter, and a voltage-controlled oscillator (VCO). The first PFD outputs a first up-signal and a first down-signal. The second PFD outputs a second up-signal and a second down-signal. The lock detector outputs an inverted lock signal. The selective charge pump outputs a pumping current. The loop filter generates a control voltage in response to the pumping current. The VCO generates the external clock signal having a frequency determined in accordance with the control voltage. The PLL has a faster locking time because the PFDs included in the PLL are capable of detecting a phase difference in a missing edge.

31 Claims, 6 Drawing Sheets

FIG. 9

FAST LOCKING PHASE LOCKED LOOP FOR SYNCHRONIZATION WITH AN INPUT SIGNAL

CROSS-REFERENCE TO RELATED APPLICATIONS

This application claims priority under 35 USC § 119 to Korean Patent Application No. 10-2006-0045925, filed on May 23, 2006 in the Korean Intellectual Property Office (KIPO), the contents of which are incorporated herein by reference in their entireties.

BACKGROUND OF THE INVENTION

1. Field of the Invention

The present invention relates to a phase locked loop (PLL). More particularly, the present invention relates to a fast locking PLL that has a relatively faster locking time.

2. Description of the Related Art

A PLL is a basic architecture used for generating an internal clock signal in an application-specific integrated circuit (ASIC) and a system-on-chip (SOC), and is widely used for synchronization with an input signal.

Figure 1:
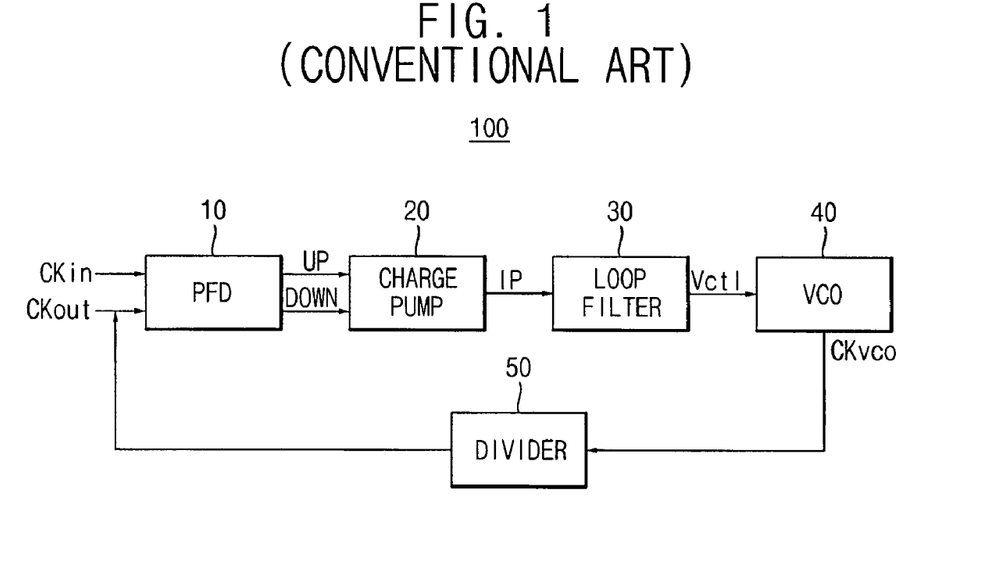
FIG. 1 is a schematic block diagram illustrating a conventional phase locked loop (PLL)

FIG. 1 is a schematic block diagram illustrating a conventional PLL.

Referring to the PLL 100, a phase frequency detector (PFD) 10 compares a phase difference of a reference signal CKin and an output signal CKout of the divider 50. The output of PFD 10 drives a charge pump 20, and the charge pump 20 drives a loop filter 30 connected to the VCO 40. The VCO 40 generates a variable frequency signal CKvco in response to a control voltage Vctl of the loop filter 30. The VCO 40 provides the divider 50 with the variable frequency signal CKvco. The divider 50 provides the PFD 10 with the output signal CKout by dividing the variable frequency signal CKvco.

Figure 2A:
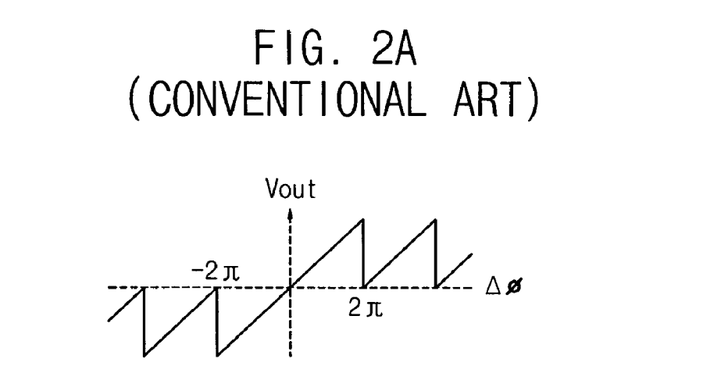
FIG. 2A is a graph illustrating an output voltage of an ideal phase frequency detector (PFD) in accordance with a phase difference of the ideal PFD.
Figure 2B:
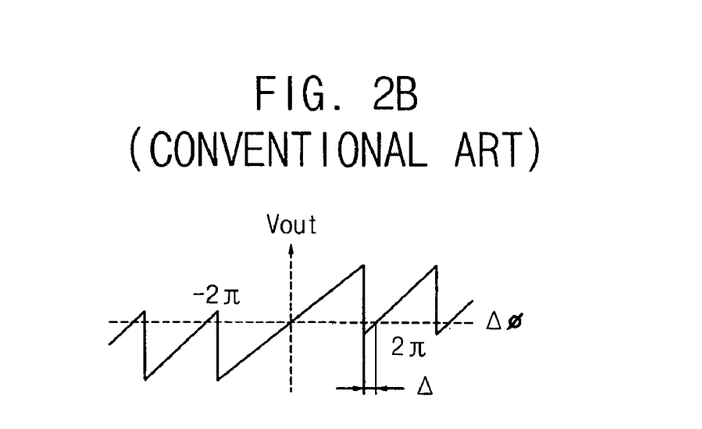
FIG. 2B is a graph illustrating an output voltage of an actual PFD in accordance with a phase difference of the actual PFD.

FIG. 2A is a graph illustrating an output voltage of an ideal phase frequency detector (PFD) in accordance with a phase difference of an ideal PFD. FIG. 2B is a graph illustrating an output voltage of an actual PFD in accordance with a phase difference of an actual PFD.

Referring to FIG. 2A, an ideal PFD has a linear region at an interval between $-2\pi$ and $2\pi$ of a graph illustrating the output voltage of the PFD in accordance with a phase difference. Referring to FIG. 2B, an actual PFD such as the conventional PFD 100, however, has a missing edge that misses a phase difference between the reference signal and the output signal. Accordingly, the PLL 100 has a longer locking time as a width of the missing edge increases.

Figure 3:
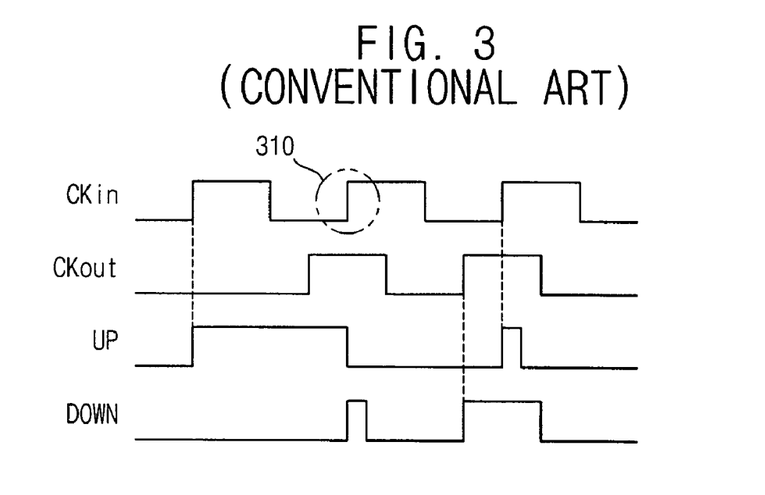
FIG. 3 is a timing diagram illustrating transitions of various signals of a conventional PFD 100.

FIG. 3 is a timing diagram illustrating transitions of various signals of the conventional PFD 100. Referring to FIG. 3, the up-signal UP does not follow the reference signal CKin in the region of the missing edge 310.

SUMMARY OF THE INVENTION

Example embodiments of the present invention provide a phase frequency detector (PFD) that can properly detect a phase difference despite the presence of a missing edge.

Example embodiments of the present invention provide a lock detector that may output a lock signal in accordance with a reduced phase difference when an up-signal and a down-signal become locked.

Example embodiments of the present invention provide a phase locked loop that can have a faster locking time.

In one aspect, a PFD includes an up-signal generating unit, a down-signal generating unit, a first buffer, a second buffer, and a reset signal generator. The up-signal generating unit includes a first stage and a second stage. The first stage generates a first control signal in accordance with an internal clock signal and a reset signal. The second stage generates a first output signal synchronized with a front edge of the internal clock signal in accordance with the internal clock signal, an inverted signal of the reset signal and the first control signal. The down-signal generating unit includes a third stage and a fourth stage. The third stage generates a second control signal in accordance with an external clock signal and the reset signal. The fourth stage generates a second output signal synchronized with a front edge of the external clock signal in accordance with the external clock signal, the inverted signal of the reset signal and the second control signal. The first buffer receives and inverts the first output signal to output an up-signal. The second buffer receives and inverts the second output signal to output a down-signal. The reset signal generator receives the first and second output signals to output the reset signal that deactivates the up-signal and the down-signal. The reset signal is activated when the up-signal and the down-signal are simultaneously activated.

In some example embodiments, the PFD may further include a third buffer that inverts the reset signal.

In some example embodiments, the first control signal may be activated when the internal clock signal is in a deactivation state, and may be deactivated when the reset signal and the internal clock signal are simultaneously activated. The second control signal may be activated when the external clock signal is in a deactivation state, and may be deactivated when the reset signal and the external clock signal are simultaneously activated. The second output signal may be activated when the external clock signal and the second control signal are in a deactivation state, and may be deactivated when the external clock signal is activated. The front edge of the internal clock signal can correspond to a rising edge of the internal clock signal and the front edge of the external clock signal corresponds to a rising edge of the external clock signal. The up-signal and the down-signal may be deactivated at the falling edge of the reset signal.

In another aspect, a phase frequency detector (PFD) includes a first positive-channel metal oxide semiconductor (PMOS) transistor having a source coupled to a first voltage supply, and a gate to which an internal clock signal is applied; a first negative-channel metal oxide semiconductor (NMOS) transistor having a drain coupled to a drain of the first PMOS transistor and a gate to which a reset signal is applied; a second NMOS transistor having a drain coupled to a source of the first NMOS transistor, a source coupled to a second voltage supply, and a gate to which the reset signal is applied; a second PMOS transistor having a source coupled to the first voltage supply, and a gate coupled to the drain of the first NMOS transistor; a third NMOS transistor having a drain coupled to a drain of the second PMOS transistor, and a gate to which the internal clock signal is applied; a fourth NMOS transistor having a drain coupled to a source of the third NMOS transistor, a source coupled to the second voltage supply, and a gate coupled to the gate of the second PMOS transistor; a third PMOS transistor having a source coupled to the first voltage supply, a drain coupled to the drain of the third NMOS transistor, and a gate to which an inverted signal of the reset signal is applied; a fourth PMOS transistor having a source coupled to the first voltage supply, and a gate to which an external clock signal is applied; a fifth NMOS transistor having a drain coupled to a drain of the fourth PMOS transistor and a gate to which the reset signal is applied; a sixth NMOS transistor having a drain coupled to a source of the fifth NMOS transistor, a source coupled to the second voltage supply, and a gate to which the external clock signal is applied; a fifth PMOS transistor having a source coupled to the first voltage supply, and a gate coupled to the drain of the fifth NMOS transistor; a seventh NMOS transistor having a drain coupled to a drain of the fifth PMOS transistor, and a gate to which the external clock signal is applied; an eighth NMOS transistor having a drain coupled to a source of the seventh NMOS transistor, a source coupled to the second voltage supply, and a gate coupled to the gate of the fifth PMOS transistor; a sixth PMOS transistor having a source coupled to the first voltage supply, a drain coupled to the drain of the seventh NMOS transistor, and a gate to which the inverted signal of the reset signal is applied; and a reset circuit having a first input coupled to the drain of the third PMOS transistor, a second input coupled to the drain of the sixth PMOS transistor, and an output providing the reset signal.

In some example embodiments, the PFD may further include a buffer that inverts the reset signal.

In some example embodiments, the reset circuit may correspond to a NOR gate.

In another aspect, a lock detector of a PLL may include a first delay circuit, a second delay circuit, and an output circuit. The first delay circuit outputs a delayed up-signal synchronously with a delayed signal of an up-signal. The second delay circuit outputs a delayed down-signal synchronously with a delayed signal of a down-signal. The output circuit outputs a lock signal that is activated when the delayed up-signal and the delayed down-signal are simultaneously in a deactivation state.

In some example embodiments, the first delay circuit may include a first delayer that delays and outputs the up-signal, and a first D flip-flop that receives the up-signal at a D input terminal and an output signal of the first delayer at a control clock terminal to output the delayed up-signal at an output terminal. The second delay circuit may include a second delayer that delays and outputs the down-signal, and a second D flip-flop that receives the down-signal at a D input terminal and an output signal of the second delayer at a control clock terminal to output the delayed down-signal at an output terminal. The output circuit can comprise a NOR gate. The lock detector may further include a buffer that inverts an output signal of the output circuit.

In another aspect, a fast locking PLL may include a first PFD, a second PFD, a lock detector, an up-signal output unit, a down-signal output unit, a selective charge pump, a loop filter, and a voltage-controlled oscillator (VCO). The first PFD outputs a first up-signal and a first down-signal in accordance with an internal clock signal and an external clock signal, respectively. The first up-signal is synchronized with a front edge of the internal clock signal, and the first down-signal is synchronized with a front edge of the external clock signal. The second PFD outputs a second up-signal and a second down-signal in accordance with the internal clock signal and the external clock signal, respectively. The second up-signal is synchronized with a tail edge of the internal clock signal, and the second down-signal is synchronized with a tail edge of the external clock signal. The lock detector outputs an inverted lock signal in accordance with the first up-signal and the first down-signal. The inverted lock signal is activated when the first up-signal and the first down-signal are simultaneously in a deactivation state. The up-signal output unit outputs an up-signal that is deactivated when the first up-signal, the second up-signal and the inverted lock signal are simultaneously in a deactivation state. The down-signal output unit outputs a down-signal that is deactivated when the first down-signal, the second down-signal and the inverted lock signal are simultaneously in a deactivation state. The selective charge pump selectively outputs a pumping current in response to the up-signal, the down-signal, the first up-signal and the first down-signal. The loop filter generates a control voltage in response to the pumping current. The VCO generates the external clock signal that has a frequency that is determined in accordance with the control voltage.

In some example embodiments, the fast locking PLL may further include a divider that divides the external clock signal by a predetermined division factor.

In some example embodiments, the selective charge pump may include a first current source and a second current source that have gains substantially different from each other. The gain of the first current source may be substantially greater than the gain of the second current source.

In some example embodiments, the loop filter may charge and discharge the control voltage at a substantially different speed depending whether or not the up-signal and the down-signal are activated. The loop filter may include a first capacitor having a first terminal coupled to an output terminal of the selective charge pump and a second terminal coupled to a ground source; a first resistor having a first terminal coupled to the output terminal of the selective charge pump; a second resistor having a first terminal selectively coupled to the output terminal of the selective charge pump in accordance with a combination of the up-signal and the down-signal; a logic gate that selectively couples the first terminal of the second resistor to the output terminal of the selective charge pump in accordance with the combination of the up-signal and the down-signal; and a second capacitor having a first terminal coupled to a second terminal of the first resistor and a second terminal of the second resistor, and a second terminal coupled to the ground source.

Accordingly, the PLL according to an example embodiment of the present invention can have a faster locking time because the PLL includes the PFD capable of detecting a phase difference in the missing edge.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION OF EMBODIMENTS OF THE INVENTION

Embodiments of the present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
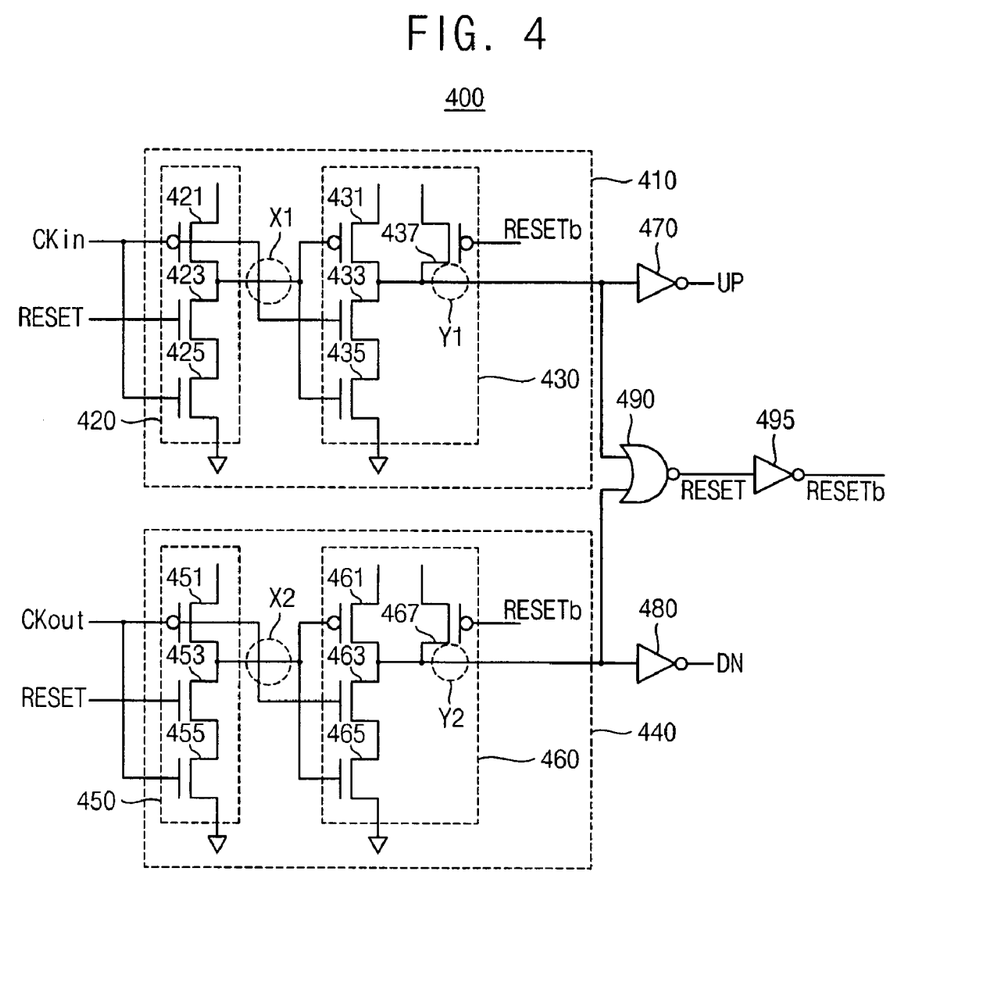
FIG. 4 is a schematic circuit diagram illustrating a PFD according to an example embodiment of the present invention.

FIG. 4 is a schematic circuit diagram illustrating a phase frequency detector (PFD) according to an example embodiment of the present invention.

Referring to FIG. 4, the PFD 400 includes an up-signal generating unit 410, a down-signal generating unit 440, a first buffer 470, a second buffer 480, and a reset signal generator 490. The PFD further includes a third buffer 495. In an example embodiment, the buffers 470, 480 and 495 can be implemented with inverters, and the reset signal generator 490 may be implemented with a NOR gate.

The up-signal generating unit 410 includes a first stage 420 and a second stage 430. The first stage 420 generates a first control signal X1 in accordance with an internal clock signal CKin and a reset signal RESET. The second stage generates a first output signal Y1 synchronized with a front edge of the internal clock signal in accordance with the internal clock signal CKin, an inverted signal of the reset signal RESETb and the first control signal X1.

The down-signal generating unit 440 includes a third stage 450 and a fourth stage 460. The third stage 450 generates a second control signal X2 in accordance with an external clock signal CKout and the reset signal RESET The fourth stage 460 generates a second output signal Y2 synchronized with a front edge of the external clock signal CKout in accordance with the external clock signal CKout, the inverted signal of the reset signal RESETb and the second control signal X2.

The first stage 420 includes a first PMOS transistor 421 having a source coupled to a first voltage supply, and a gate to which the internal clock signal CKin is applied. The first stage 420 includes a first NMOS transistor 423 having a drain coupled to a drain of the first PMOS transistor 421 and a gate to which the reset signal RESET is applied. Additionally, the first stage 420 includes a second NMOS transistor 425 having a drain coupled to a source of the first NMOS transistor 423, a source coupled to a second voltage supply, and a gate to which the reset signal RESET is applied.

The second stage 430 includes a second PMOS transistor 431 having a source coupled to the first voltage supply, and a gate coupled to the drain of the first NMOS transistor 423. Further, the second stage 430 includes a third NMOS transistor 433 having a drain coupled to a drain of the second PMOS transistor 431, and a gate to which the internal clock signal CKin is applied. Furthermore, the second stage 430 includes a fourth NMOS transistor 435 having a drain coupled to a source of the third NMOS transistor 433, a source coupled to a second voltage supply, and a gate coupled to the gate of the second PMOS transistor 431. Additionally, the second stage 430 includes a third. PMOS transistor 437 having a source coupled to the first voltage supply, a drain coupled to the drain of the third NMOS transistor 433, and a gate to which the inverted signal of the reset signal RESETb is applied. The first output signal Y1 is provided at the drain of the third PMOS transistor 437.

The third stage 450 includes a fourth PMOS transistor 451 having a source coupled to the first voltage supply, and a gate to which the external clock signal CKout is applied. The third stage 450 includes a fifth NMOS transistor 453 having a drain coupled to a drain of the fourth PMOS transistor 451 and a gate to which the reset signal RESET is applied. The third stage 450 includes a sixth NMOS 455 transistor having a drain coupled to a source of the fifth NMOS transistor 453, a source coupled to a second voltage supply, and a gate to which the external clock signal CKout is applied.

The fourth stage 460 includes a fifth PMOS transistor 461 having a source coupled to the first voltage supply, and a gate coupled to the drain of the fifth NMOS 453 transistor. The fourth stage 460 includes a seventh NMOS transistor 463 having a drain coupled to a drain of the fifth PMOS transistor 461, and a gate to which the external clock signal CKout is applied. The fourth stage 460 includes an eighth NMOS transistor 465 having a drain coupled to a source of the seventh NMOS transistor 463, a source coupled to the second voltage supply, and a gate coupled to the gate of the fifth PMOS transistor 461. The fourth stage 460 includes a sixth PMOS transistor 467 having a source coupled to the first voltage supply, a drain coupled to the drain of the seventh NMOS transistor 463, and a gate to which the inverted signal of the reset signal RESETb is applied. The second output signal Y2 is provided at the drain of the sixth PMOS transistor 467.

The first buffer 470 receives and inverts the first output signal Y1 to output an up-signal UP. The second buffer 480 receives and inverts the second output signal Y2 to output a down-signal DN.

Figure 5:
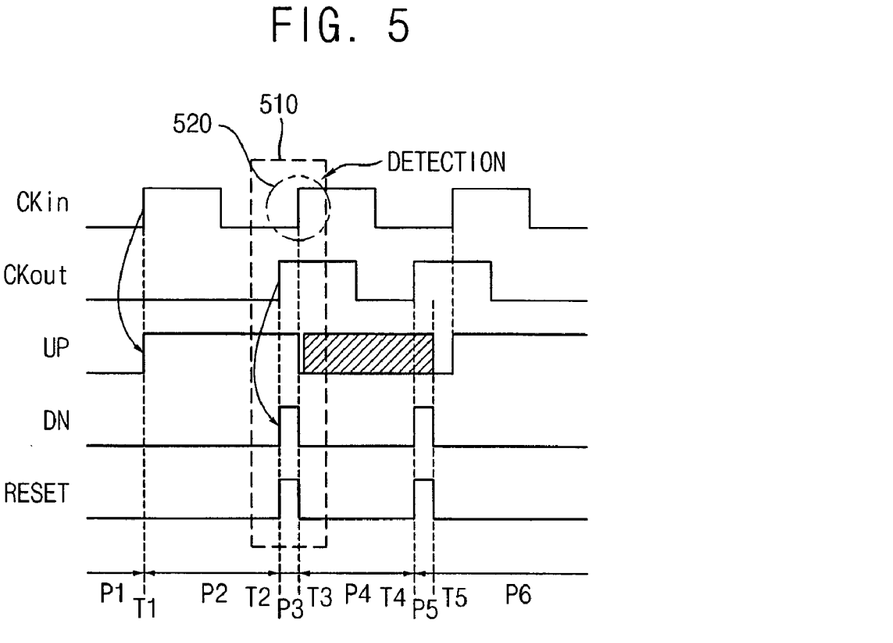
FIG. 5 is a timing diagram illustrating various signals of the PFD of FIG. 4.

FIG. 5 is a timing diagram illustrating various signals of the PFD in FIG. 4. Hereinafter, operation of the PFD in FIG. 4 is described with reference to FIGS. 4 and 5.

It is assumed that the reset signal RESET and the internal clock signal CKin are initially logic 'low.' During period P1, the first PMOS transistor 421 is turned on, because the internal clock signal CKin is logic 'low.' Then a node X1 becomes logic 'high.' The fourth NMOS transistor 435 is turned on. In this case, a node Y1 is still logic 'low' because the reset signal RESET is logic 'low.'

At time T1, i.e., when the internal clock signal CKin becomes logic 'high,' the third NMOS transistor 433 is turned on and the node Y1 becomes logic 'low.' Then, the up-signal UP becomes logic 'high' because the logic 'low' of Y1 node passes through the inverter 470 and becomes logic 'high.' This state is maintained throughout period P2.

At time T2, the fourth PMOS transistor 451 is turned on, and a node X2 becomes logic 'high,' because the external clock signal CKout is logic 'low.' Then the eighth NMOS transistor 465 is turned on. At time T2, i.e., when the external clock signal CKout becomes logic 'high,' the seventh NMOS transistor 463 is turned on. Then a node Y2 becomes logic 'low' and the down-signal DN becomes logic 'high,' because of the output state of the inverter 480. During the time period P3 that follows, both the up-signal UP and the down-signal DN are logic 'high,' and the up-signal UP and the down-signal DN are in locked state. In locked state, the reset signal RESET and an output signal of the reset signal generator 490 become logic 'high.' Then, the first NMOS transistor 423 and the fifth NMOS transistor 453 are turned on, because the reset signal RESET is logic 'high.' As a result the node X1 and the node X2 become logic 'low.' Further, the nodes Y1 and Y2 become logic 'low,' and the down-signal Dn becomes logic 'low.'

At time T3, when the internal clock signal CKin becomes logic 'high,' the up-signal UP becomes logic 'high' as described during the period P1. In this manner, a missing edge is detected as illustrated in a portion 510 during a period 510. These operations are repeated during periods P4, P5 and P6.

Figure 6A:
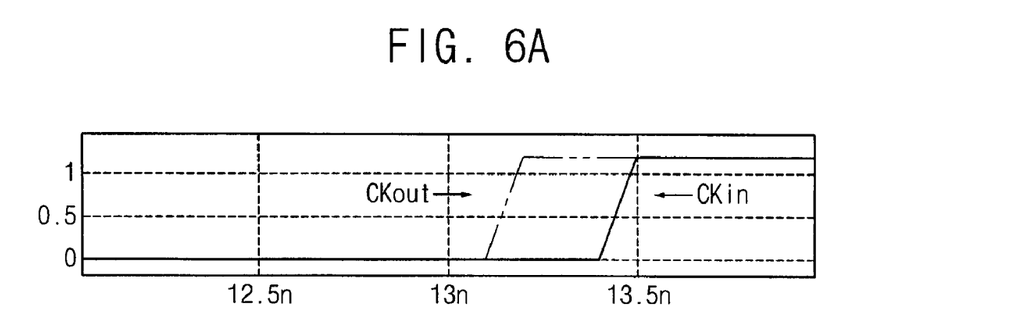
FIG. 6A is a timing diagram illustrating transitions of the internal clock signal and the external clock signal applied to a conventional PFD in FIG. 1 and the PFD in FIG. 4.

FIG. 6A is a timing diagram illustrating transitions of the internal clock signal and the external clock signal applied to a conventional PFD and the PFD 400 of the present invention.

Figure 6B:
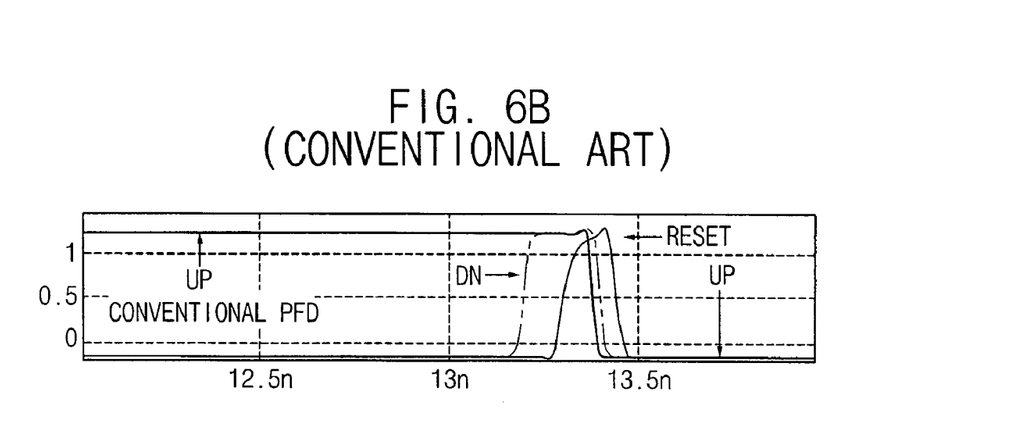
FIG. 6B is a timing diagram illustrating transitions of the up-signal and the down-signal of the conventional PFD in FIG. 1.

FIG. 6B is a timing diagram illustrating transitions of the up-signal UP and the down-signal DN of the conventional PFD.

Figure 6C:
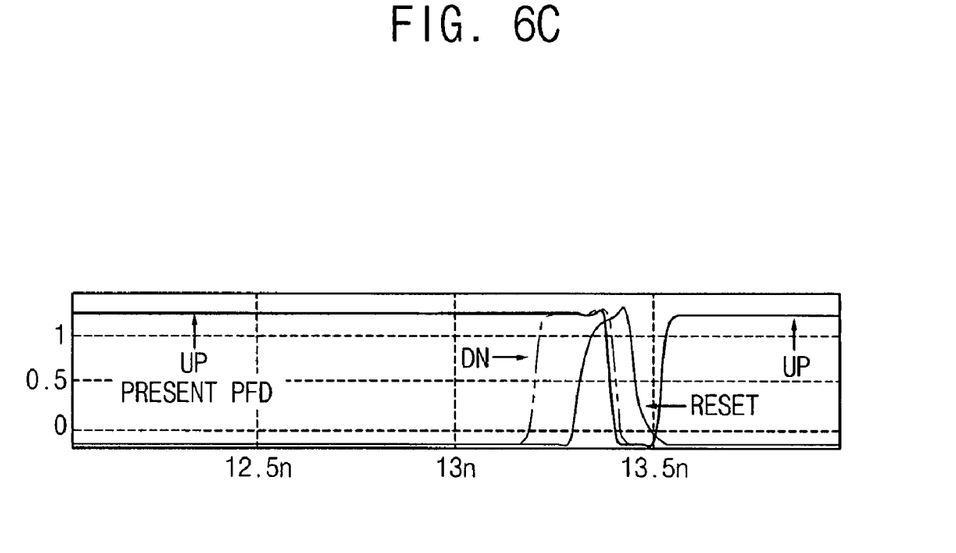
FIG. 6C is a timing diagram illustrating transitions of the up-signal and the down-signal of the PFD in FIG. 4.

FIG. 6C is a timing diagram illustrating transitions of the up-signal UP and the down-signal DN of the PFD 400 in FIG. 4 according to the present invention.

Referring to FIGS. 6A to 6C, in the conventional architecture, the up-signal UP is not capable of detecting the internal clock signal CKin when the internal clock signal CKin transits to logic 'high' after the reset signal RESET transits to logic 'high.' On the contrary, the embodiment of the PFD according to the present invention, for example that illustrated in FIG. 4, the up-signal UP transitions to logic 'high' following the internal clock signal CKin, after the reset signal RESET transits to logic 'high.' The missing edge is thus detected by the embodiment of the PFD 400 illustrated in FIG. 4.

Figure 7:
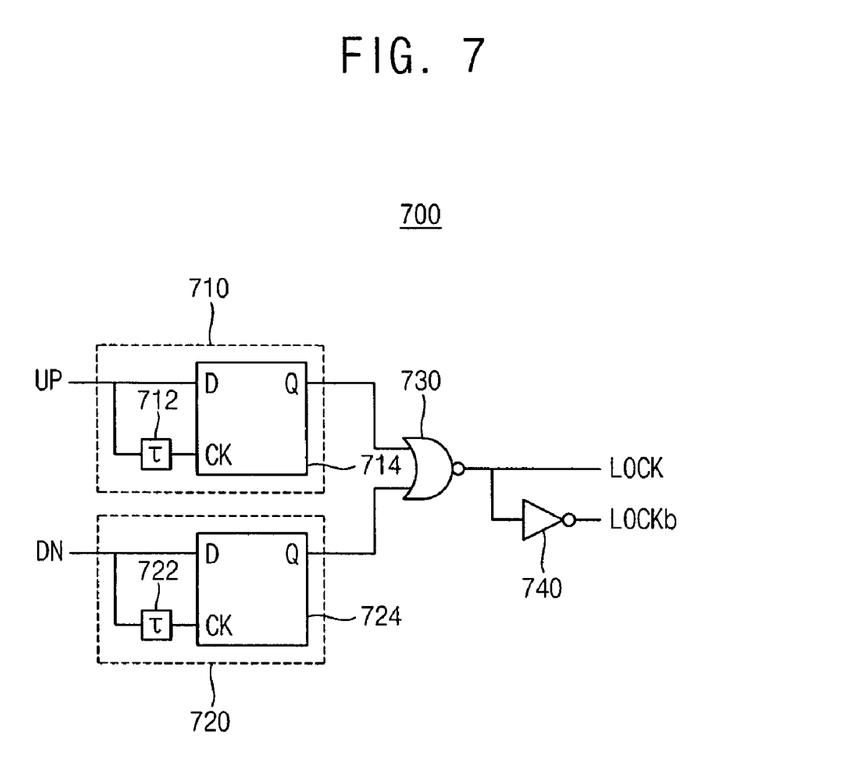
FIG. 7 is a schematic circuit diagram illustrating a lock detector of a PLL according to an example embodiment of the present invention.

FIG. 7 is a schematic circuit diagram illustrating a lock detector of a phase locked loop according to an example embodiment of the present invention.

Referring to FIG. 7, a lock detector 700 includes a first delay circuit 710, a second delay circuit 720 and an output circuit 730. The lock detector 700 may further include a buffer 740 inverting an output signal of the output circuit.

The first delay circuit 710 outputs a delayed up-signal UP synchronously with a delayed signal of an up-signal DN. The first delay circuit 710 includes a first delayer 712 that delays and outputs the up-signal UP. The first delay circuit 710 includes a first D flip-flop 714 that receives the up-signal UP at a D input terminal and an output signal of the first delayer 712 at a control clock CK terminal to output the delayed up-signal UP at an output terminal.

The second delay circuit 720 outputs a delayed down-signal DN synchronously with a delayed signal of a down-signal DN. The second delay circuit 720 includes a second delayer 722 that delays and outputs the down-signal DN. The second delay circuit 720 includes a second D flip-flop 724 that receives the down-signal DN at a D input terminal and an output signal of the second delayer at a control clock terminal to output the delayed down-signal DN at an output terminal.

The output circuit 730 outputs a lock signal LOCK that is activated when the delayed up-signal UP and the delayed down-signal DN are simultaneously in a deactivation state. The output circuit 730 may be implemented with a NOR gate. The buffer 740 may be implemented with an inverter.

The lock detector outputs the lock signal LOCK that is logic 'high' when the Up-signal UP and the down-signal DN are simultaneously logic 'low.' That is, the lock detector outputs the lock signal LOCK that is logic 'high' by taking into consideration that a phase difference of the up-signal UP and the down-signal DN decreases when the up-signal UP and the down-signal DN become locked.

Figure 8:
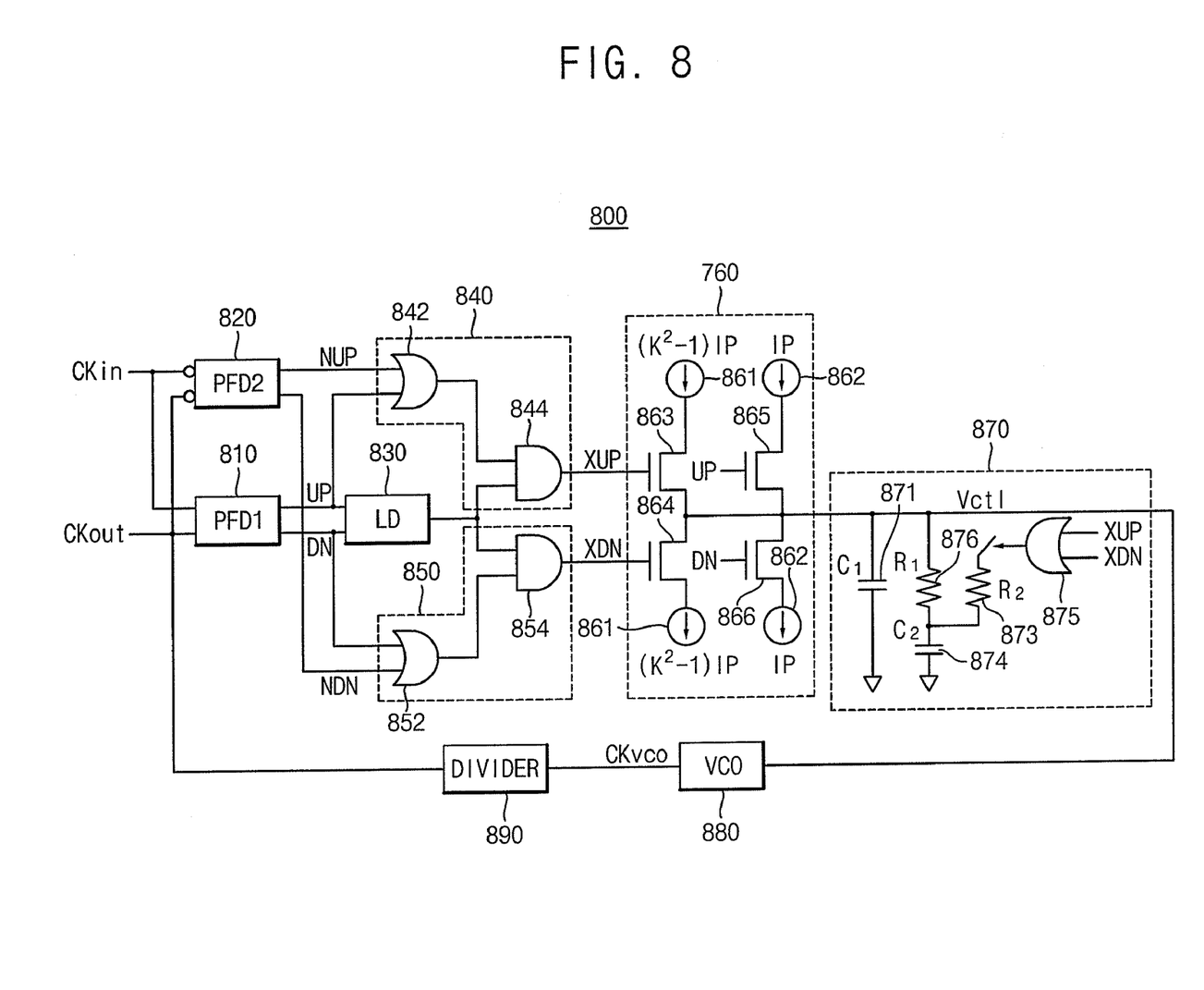
FIG. 8 is a schematic circuit diagram illustrating a fast locking PLL according to an example embodiment of the present invention.

FIG. 8 is a schematic circuit diagram illustrating a fast locking phase locked loop (PLL) according to an example embodiment of the present invention.

The PLL 800 includes a first phase frequency detector (PFD) 810, a second PFD 820, a lock detector 830, an up-signal output unit 840, a down-signal output unit 850, a selective charge pump 760, a loop filter 870, and a voltage-controlled oscillator (VCO) 880. The PLL 800 may further include a divider 890.

The first PFD 810 is implemented, for example, using the PFD 400 of FIG. 4. The first PFD 810 outputs a first up-signal UP and a first down-signal DN in accordance with an internal clock signal CKin and an external clock signal CKout. The first up-signal UP is synchronized with a front edge of the internal clock signal CKin. The front edge corresponds to a rising edge of the internal clock signal CKin. The first down-signal DN is synchronized with a front edge of the external clock signal CKout. The front edge corresponds to a rising edge of the external clock signal CKout.

The second PFD 820 is also implemented in this example using the PFD 400 of FIG. 4, but the second PFD receives the internal clock signal CKin and the external clock signal CKout that are inverted. The second PFD 820 outputs a second up-signal NUP and a second down-signal NDN in accordance with the internal clock signal CKin and the external clock signal CKout. The second up-signal NUP is synchronized with a tail edge of the internal clock signal CKin. The tail edge corresponds to a falling edge of the internal clock signal CKin. The second down-signal NDN is synchronized with a tail edge of the external clock signal CKout. The tail edge corresponds to a falling edge of the external clock signal CKout.

The lock detector 830 is implemented, for example, using the lock detector 700 of FIG. 7. The lock detector 830 receives the first up-signal UP and the first down-signal DN and outputs an inverted lock signal LOCKb that is deactivated when the first up-signal UP and the first down-signal DN are simultaneously logic 'low.'

The up-signal output unit 840 outputs an up-signal XUP that is deactivated when the first up-signal UP, the second up-signal NUP and the inverted lock signal LOCKb are simultaneously logic 'low.' The up-signal output unit 840 includes a first OR gate 842 and a first AND gate 844. The first OR gate 842 performs an OR operation of the first up-signal UP and the second up-signal NUP. The first AND gate 844 performs an AND operation of an output signal of the first OR gate 842 and the inverted lock signal LOCKb to output the up-signal XUP.

The down-signal output unit 850 outputs an down-signal XDN that is deactivated when the first down-signal DN, the second down-signal NDN and the inverted lock signal LOCKb are simultaneously logic 'low.' The down-signal output unit 850 includes a second OR gate 852 and a second AND gate 854. The second OR gate 852 performs an OR operation of the first down-signal DN and the second down-signal NDN. The second AND gate 854 performs an AND operation of an output signal of the second OR gate 852 and the inverted lock signal LOCKb to output the down-signal XDN.

The selective charge pump 760 outputs a pumping current selectively in response to the up-signal XUP, the down-signal XDN, the first up-signal UP and the first down-signal DN. The selective charge pump 760 includes a first current source 861 and a second current source 862 that have gains substantially different from each other. The selective charge pump 760 includes first to fourth NMOS transistors 863, 864, 865 and 866. The first and second NMOS transistors 863 and 864 serve as switches for charging a current having magnitude of $(K^2-1)IP$ of the current source 861 to the loop filter 870, or discharging the current having magnitude of $(K^2-1)IP$ of the current source 861 from the loop filter 870 based on whether the up-signal XUP and the down-signal XDN are activated. The third and fourth NMOS transistors 865 and 867 serve as switches for charging a current having magnitude of IP of the current source 862 to the loop filter 870, or discharging the current having magnitude of IP of the current source 862 from the loop filter 870 based on whether the first up-signal UP and the first down-signal DN are activated.

The loop filter 870 generates a control voltage Vctl in response to the pumping current of the selective charge pump 760. The loop filter 870 includes a first capacitor 871 having a first terminal coupled to the output terminal of the selective charge pump 760. The loop filter 870 further includes a first resistor 876 having a first terminal coupled to the output terminal of the selective charge pump 760. The loop filter 870 further includes a second resistor 873 having a first terminal selectively coupled to the output terminal of the selective charge pump 760 in accordance with the up-signal XUP and the down-signal XDN. The loop filter 870 further includes a logic gate 875 that selectively couples the first terminal of the second resistor 873 to the output terminal of the selective charge pump 760 in accordance with the up-signal XUP and the down-signal XDN. The logic gate 875 may be implemented with an OR gate. The loop filter 870 includes a second capacitor 874 that has a first terminal coupled to a second terminal of the first resistor R1 and a second terminal of the second resistor 873, and a second terminal coupled to a ground source. Resistances of the first resistor 876 and the second resistor 873 are coupled in parallel corresponds to 1/K resistance of the first resistor 876 when the first terminal of the second resistor 873 is coupled to the output terminal of the selective charge pump 760. In this case, K corresponds to a constant substantially greater than about 1. Then, the selective charge pump 760 provides the loop filter 870 in an out-of-lock region of the PLL 800 with a current having magnitude of $(K^2-1)IP$. Then, a loop bandwidth of the PLL 800 increases by K times, and the lock-time of the PLL 800 is reduced.

The VCO 880 generates a clock signal CKvco that has a frequency determined in accordance with the control voltage Vctl of the loop filter 870.

The divider 890 divides the clock signal CKvco by a predetermined division rate to provide the first and second PFDs 810 and 820 with the external clock signal CKout. The first PFD 810 compares a phase difference between the internal clock signal CKin and the external clock signal CKout to generate the first up-signal UP and the first down-signal DN in accordance with the phase difference between the internal clock signal CKin and the external clock signal CKout. The second PFD 820 compares a phase difference between the internal clock signal CKin and the external clock signal CKout to generate the second up-signal NUP and the second down-signal NDN in accordance with the phase difference between the internal clock signal CKin and the external clock signal CKout. The divider 980 is an optional component that may or may not be included in the PLL 800 according to an example embodiment of the present invention. In a case where the divider 980 is not included, the clock signal CKvco of the VCO 880 corresponds to the external clock signal CKout.

Figure 9:
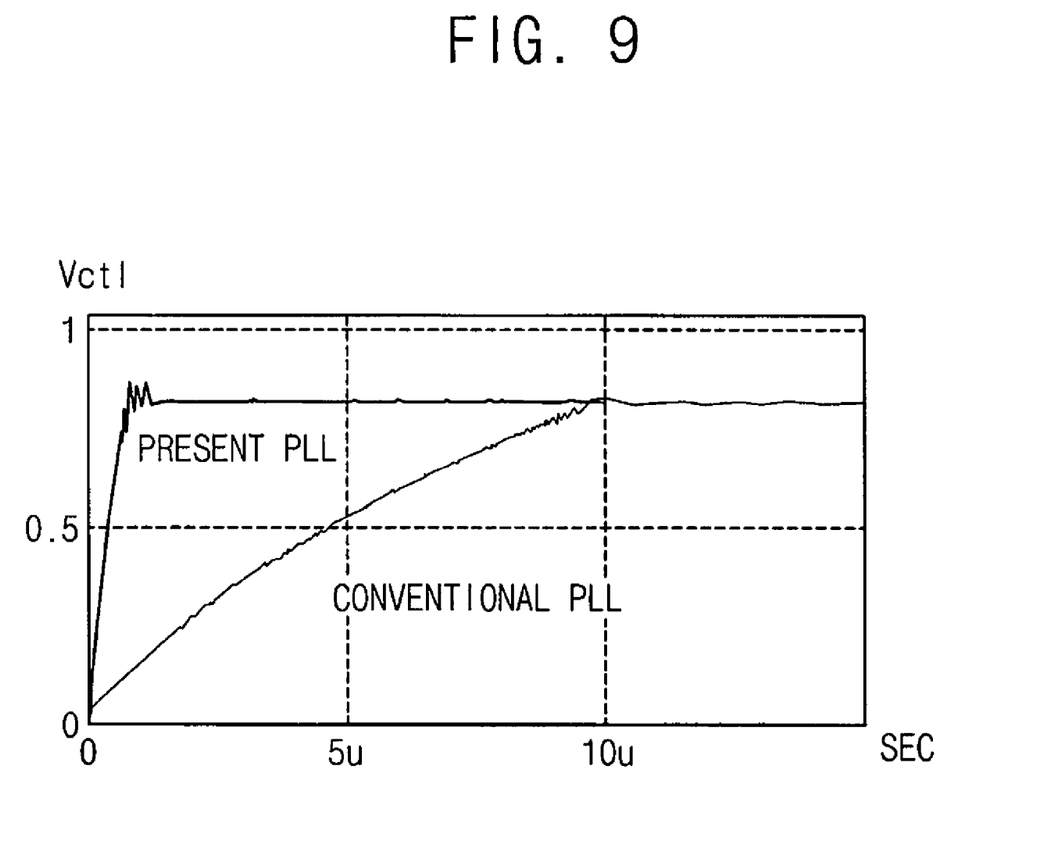
FIG. 9 is a simulation diagram illustrating the resulting control voltage in FIG. 8 when adopting the PLL of the present invention.

FIG. 9 is a simulation diagram illustrating the control voltage in FIG. 8 when adopting the PLL of the embodiments of the present invention.

Referring to FIG. 9, when the PLL 800 in accordance with embodiments of the present invention is adopted, the control voltage Vctl reaches a target voltage about 83% faster than when the PLL of the conventional art is adopted. The shortened time to increase the control voltage Vctl to the target voltage also represents a decrease in locking time.

As mentioned above, according to example embodiments of the present invention, the PFD has a relatively faster locking time by detecting a phase difference in the missing edge. The lock detector, according to an example embodiment of the present invention, outputs the lock signal in accordance with the reduced phase difference when the up-signal UP and the down-signal DN become locked. Additionally, the PLL has a faster locking time by adopting the PFD and the lock detector, for example of the type illustrated in the above embodiments.

Having thus described example embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A phase frequency detector comprising:
an up-signal generating unit including a first stage and a second stage, the first stage generating a first control signal in accordance with an internal clock signal and a reset signal, the second stage generating a first output signal synchronized with a front edge of the internal clock signal in accordance with the internal clock signal, an inverted signal of the reset signal, and the first control signal;
a down-signal generating unit including a third stage and a fourth stage, the third stage generating a second control signal in accordance with an external clock signal and the reset signal, the fourth stage generating a second output signal synchronized with a front edge of the external clock signal in accordance with the external clock signal, the inverted signal of the reset signal, and the second control signal;
a first buffer receiving and inverting the first output signal to output an up-signal;
a second buffer receiving and inverting the second output signal to output a down-signal; and
a reset signal generator receiving the first and second output signals to output the reset signal that deactivates the up-signal and the down-signal, the reset signal being activated when the up-signal and the down-signal are simultaneously activated, wherein the first control signal is activated when the internal clock signal is in a deactivation state, and is deactivated when the reset signal and the internal clock signal are simultaneously activated, and wherein the first output signal is activated when the first control signal is in a deactivation state, and is deactivated when the internal clock signal is activated.

2. The PFD of claim 1, further comprising a third buffer inverting the reset signal.

3. The PFD of claim 1, wherein the second control signal is activated when the external clock signal is in a deactivation state, and is deactivated when the reset signal and the external clock signal are simultaneously activated.

4. The PFD of claim 3, wherein the second output signal is activated when the external clock signal and the second control signal are in a deactivation state, and is deactivated when the external clock signal is activated.

5. The PFD of claim 1, wherein the front edge of the internal clock signal corresponds to a rising edge of the internal clock signal and wherein the front edge of the external clock signal corresponds to a rising edge of the external clock signal.

6. The PFD of claim 5, wherein the reset signal simultaneously deactivates the up-signal and the down-signal.

7. The PFD of claim 6, wherein the up-signal and the down-signal are deactivated at a falling edge of the reset signal.

8. A phase frequency detector (PFD) comprising:
a first PMOS transistor having a source coupled to a first voltage supply, and a gate to which an internal clock signal is applied;
a first NMOS transistor having a drain coupled to a drain of the first PMOS transistor and a gate to which a reset signal is applied;
a second NMOS transistor having a drain coupled to a source of the first NMOS transistor, a source coupled to a second voltage supply, and a gate to which the reset signal is applied;
a second PMOS transistor having a source coupled to the first voltage supply, and a gate coupled to the drain of the first NMOS transistor;
a third NMOS transistor having a drain coupled to a drain of the second PMOS transistor, and a gate to which the internal clock signal is applied;
a fourth NMOS transistor having a drain coupled to a source of the third NMOS transistor, a source coupled to the second voltage supply, and a gate coupled to the gate of the second PMOS transistor;
a third PMOS transistor having a source coupled to the first voltage supply, a drain coupled to the drain of the third NMOS transistor, and a gate to which an inverted signal of the reset signal is applied;
a fourth PMOS transistor having a source coupled to the first voltage supply, and a gate to which an external clock signal is applied;
a fifth NMOS transistor having a drain coupled to a drain of the fourth PMOS transistor and a gate to which the reset signal is applied;
a sixth NMOS transistor having a drain coupled to a source of the fifth NMOS transistor, a source coupled to the second voltage supply, and a gate to which the external clock signal is applied;
a fifth PMOS transistor having a source coupled to the first voltage supply, and a gate coupled to the drain of the fifth NMOS transistor;
seventh NMOS transistor having a drain coupled to a drain of the fifth PMOS transistor, and a gate to which the external clock signal is applied;
an eighth NMOS transistor having a drain coupled to a source of the seventh NMOS transistor, a source coupled to the second voltage supply, and a gate coupled to the gate of the fifth PMOS transistor;
a sixth PMOS transistor having a source coupled to the first voltage supply, a drain coupled to the drain of the seventh NMOS transistor, and a gate to which the inverted signal of the reset signal is applied; and
a reset circuit having a first input coupled to the drain of the third PMOS transistor, a second input coupled to the drain of the sixth PMOS transistor, and an output providing the reset signal, the PMOS representing p-type metal oxide semiconductor, the NMOS representing n-type metal oxide semiconductor.

9. The PFD of claim 8, further comprising a buffer inverting the reset signal.

10. The PFD of claim 8, wherein the reset circuit comprises a NOR gate.

11. A lock detector of a phase locked loop (PLL) comprising:
a first delay circuit outputting a delayed up-signal synchronously with a delayed signal of an up-signal;
a second delay circuit outputting a delayed down-signal synchronously with a delayed signal of a down-signal; and
an output circuit outputting a lock signal that is activated when the delayed up-signal and the delayed down-signal are simultaneously in a deactivation state, wherein the first delay circuit comprises:
a first delayer delaying and outputting the up-signal; and
a first D flip-flop receiving the up-signal at a D input terminal and an output signal of the first delayer at a control clock terminal to output the delayed up-signal at an output terminal.

12. The lock detector of claim 11, wherein the second delay circuit comprises:
a second delayer delaying and outputting the down-signal; and
a second D flip-flop receiving the down-signal at a D input terminal and an output signal of the second delayer at a control clock terminal to output the delayed down-signal at an output terminal.

13. The lock detector of claim 11, wherein the output circuit comprises a NOR gate.

14. The lock detector of claim 11, further comprising a buffer that inverts an output signal of the output circuit.

15. A fast locking phase locked loop (PLL) comprising:
a first phase frequency detector (PFD) outputting a first up-signal and a first down-signal in accordance with an internal clock signal and an external clock signal, the first up-signal being synchronized with a front edge of the internal clock signal, the first down-signal being synchronized with a front edge of the external clock signal;

a second PFD outputting a second up-signal and a second down-signal in accordance with the internal clock signal and the external clock signal, the second up-signal being synchronized with a tail edge of the internal clock signal, the second down-signal being synchronized with a tail edge of the external clock signal;

a lock detector outputting an inverted lock signal in accordance with the first up-signal and the first down-signal, the inverted lock signal being activated when the first up-signal and the first down-signal are simultaneously in a deactivation state;

an up-signal output unit outputting an up-signal that is deactivated when the first up-signal, the second up-signal and the inverted lock signal are simultaneously in a deactivation state;

a down-signal output unit outputting a down-signal that is deactivated when the first down-signal, the second down-signal and the inverted lock signal are simultaneously in a deactivation state;

a selective charge pump selectively outputting a pumping current in response to the up-signal, the down-signal, the first up-signal and the first down-signal;

a loop filter generating a control voltage in response to the pumping current; and a voltage-controlled oscillator (VCO) generating the external clock signal that has a frequency that is determined in accordance with the control voltage, wherein the first PFD comprises:

a first up-signal generating unit including a first stage and a second stage, the first stage generating a first control signal in accordance with the internal clock signal and a first reset signal, the second stage generating a first output signal synchronized with a front edge of the internal clock signal in accordance with the internal clock signal, an inverted signal of the first reset signal and the first control signal, wherein the first control signal is activated when the internal clock signal is in a deactivation state, and is deactivated when the reset signal and the internal clock signal are simultaneously activated, and wherein the first output signal is activated when the first control signal is in a deactivation state, and is deactivated when the internal clock signal is activated.

16. The fast locking PLL of claim 15, further comprising a divider that divides the external clock signal by a predetermined division factor.

17. The fast locking PLL of claim 15, wherein the first PFD further comprises:

a first down-signal generating unit including a third stage and a fourth stage, the third stage generating a second control signal in accordance with the external clock signal and the first reset signal, the fourth stage generating a second output signal synchronized with a front edge of the external clock signal in accordance with the external clock signal, the inverted signal of the reset signal and the second control signal;

a first buffer receiving and inverting the first output signal to output a first up-signal;

a second buffer receiving and inverting the second output signal to output a second down-signal; and a first reset signal generator receiving the first and second output signals to output the first reset signal that deactivates the first up-signal and the first down-signal, the first reset signal being activated when the first up-signal and the first down-signal are simultaneously in an activation state.

18. The fast locking PLL of claim 17, wherein the front edge of the internal clock signal corresponds to a rising edge of the internal clock signal and wherein the front edge of the external clock signal corresponds to a rising edge of the external clock signal.

19. The fast locking PLL of claim 15, wherein the second PFD comprises:

a second up-signal generating unit including a fifth state and a sixth stage, the fifth stage generating a third clock signal in accordance with the internal clock signal and a second reset signal, the sixth stage generating a third output signal synchronized with a tail edge of the internal clock signal in accordance with the internal clock signal, an inverted signal of the second reset signal, and the third control signal; and a second down-signal generating unit including a seventh stage and an eighth stage, the seventh stage generating a fourth control signal in accordance with the external clock signal and the second reset signal, the eighth stage generating a fourth output signal synchronized with a tail edge of the external clock signal in accordance with the external clock signal, the inverted signal of the second reset signal, and the fourth control signal;

a third buffer receiving and inverting the third output signal to output a second up-signal;

a fourth buffer receiving and inverting the fourth output signal to output a second down-signal; and a second reset signal generator receiving the third and the fourth output signals to output the second reset signal that deactivates the second up-signal and the second down-signal, the second reset signal being activated when the second up-signal and the second down-signal are simultaneously in an activation state.

20. The fast locking PLL of claim 19, wherein the tail edge corresponds to a falling edge of the clock signals.

21. The fast locking PLL of claim 15, wherein the lock detector comprises:

a first delay circuit outputting a first delayed up-signal synchronously with a delayed signal of the first up-signal;

a second delay circuit outputting a second delayed down-signal synchronously with a delayed signal of the second down-signal; and an output circuit outputting a lock signal that is activated when the first delayed up-signal and the first delayed down-signal are simultaneously in an activation state.

22. The fast locking PLL of claim 21, wherein the lock detector further includes a buffer inverting the lock signal of the output circuit.

23. The fast locking PLL of claim 15, wherein the up-signal output unit includes:

a first OR gate performing an OR operation of the first up-signal and the second up-signal; and a first AND gate performing an AND operation of an output signal of the first OR gate and the inverted lock signal to output the up-signal.

24. The fast locking PLL of claim 15, wherein the down-signal output unit includes:

a second OR gate performing an OR operation of the first down-signal and the second down-signal; and a second AND gate performing an AND operation of an output signal of the second OR gate and the inverted lock signal to output the down-signal.

25. The fast locking PLL of claim 15, wherein the selective charge pump includes a first current source and a second current source that have gains substantially different from each other.

26. The fast locking PLL of claim 25, wherein a gain of the first current source is substantially greater than a gain of the second current source.

27. The fast locking PLL of claim 26, wherein the first current source charges and discharges current in response to the up-signal and the down-signal, and the second current source charges and discharges current in response to the first up-signal and the first down-signal.

28. The fast locking PLL of claim 27, wherein the selective charge pump selectively outputs the pumping current based on whether the up-signal, the down-signal, the first up-signal and the first down-signal are activated.

29. The fast locking PLL of claim 15, wherein the loop filter charges and discharges the control voltage at a substantially different speed based on whether the up-signal and the down-signal are activated.

30. The fast locking PLL of claim 29, wherein the loop filter comprises:
   a first capacitor having a first terminal coupled to an output terminal of the selective charge pump, and a second terminal coupled to a ground source;
   a first resistor having a first terminal coupled to the output terminal of the selective charge pump;
   a second resistor having a first terminal coupled to the output terminal of the selective charge pump in accordance with the up-signal and the down-signal;
   a logic gate selectively coupling the first terminal of the second resistor to the output terminal of the selective charge pump in accordance with the up-signal and the down-signal; and
   a second capacitor having a first terminal coupled to a second terminal of the first resistor and a second terminal of the second resistor, and a second terminal coupled to the ground source.

31. The fast locking PLL of claim 30, wherein resistances of the first resistor and the second resistor coupled in parallel correspond to 1/K resistance of the first resistor when the first terminal of the second resistor is coupled to the output terminal of the selective charge pump, K being a constant greater than about 1.

* * * * *